United States Patent
Konaka

(10) Patent No.: US 10,715,108 B2
(45) Date of Patent: Jul. 14, 2020

(54) FILTER DEVICE AND MULTIPLEXER

(71) Applicant: Murata Manufacturing Co., Ltd., Nagaokakyo-shi, Kyoto-fu (JP)

(72) Inventor: Yohei Konaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/391,345

(22) Filed: Apr. 23, 2019

(65) Prior Publication Data

US 2019/0253037 A1  Aug. 15, 2019

Related U.S. Application Data

(63) Continuation of application No. PCT/JP2017/036284, filed on Oct. 5, 2017.

(30) Foreign Application Priority Data

Nov. 22, 2016  (JP) ................... 2016-226698

(51) Int. Cl.
| | |
|---|---|
| *H03H 9/64* | (2006.01) |
| *H03H 9/72* | (2006.01) |
| *H03H 9/56* | (2006.01) |
| *H03H 7/01* | (2006.01) |
| *H03H 9/00* | (2006.01) |
| *H03H 9/145* | (2006.01) |

(52) U.S. Cl.
CPC .......... *H03H 9/568* (2013.01); *H03H 7/0161* (2013.01); *H03H 9/0085* (2013.01); *H03H 9/14541* (2013.01); *H03H 9/6483* (2013.01); *H03H 9/725* (2013.01)

(58) Field of Classification Search
CPC .................................. H03H 9/64; H03H 9/72
USPC .................. 333/133, 187, 189, 193
See application file for complete search history.

(56) References Cited

U.S. PATENT DOCUMENTS

| | | | |
|---|---|---|---|
| 7,271,684 B2 * | 9/2007 | Nishihara | H03H 9/0095 333/133 |
| 7,535,323 B2 * | 5/2009 | Barber | H03H 9/02086 310/357 |

(Continued)

FOREIGN PATENT DOCUMENTS

| | | |
|---|---|---|
| JP | 2010-109894 A | 5/2010 |
| JP | 2012-147175 A | 8/2012 |

(Continued)

OTHER PUBLICATIONS

Official Communication issued in International Patent Application No. PCT/JP2017/036284, dated Nov. 28, 2017.

*Primary Examiner* — Dean O Takaoka
(74) *Attorney, Agent, or Firm* — Keating & Bennett, LLP

(57) ABSTRACT

A filter device includes a first ladder filter including serial resonators disposed in a terminal-to-terminal path and parallel resonators disposed in connection paths, a first acoustic wave resonator disposed in parallel to the parallel resonator, and a second acoustic wave resonator disposed in parallel to the serial resonator. Resonance points and anti-resonance points of the first and second acoustic wave resonators are both positioned on the lower frequency side or the higher frequency side of a pass band of the first ladder filter, and on the same side of the pass band of the first ladder filter, when viewed from the pass band of the first filter.

20 Claims, 9 Drawing Sheets

(56) References Cited

U.S. PATENT DOCUMENTS

| | | | |
|---|---|---|---|
| 9,837,214 B2* | 12/2017 | Link | H01G 4/38 |
| 10,291,206 B2* | 5/2019 | Irieda | H03H 9/02228 |
| 10,476,479 B2* | 11/2019 | Park | H03H 9/703 |
| 2008/0055021 A1* | 3/2008 | Ueda | H03H 9/562 |
| | | | 333/189 |
| 2010/0109801 A1 | 5/2010 | Inoue et al. | |
| 2012/0274416 A1 | 11/2012 | Hara et al. | |
| 2013/0127566 A1 | 5/2013 | Iwaki et al. | |

FOREIGN PATENT DOCUMENTS

| JP | 2012-231437 A | 11/2012 |
|---|---|---|
| JP | 2013-110595 A | 6/2013 |

\* cited by examiner

FILTER DEVICE AND MULTIPLEXER

CROSS REFERENCE TO RELATED APPLICATIONS

This application claims the benefit of priority to Japanese Patent Application No. 2016-226698 filed on Nov. 22, 2016 and is a Continuation Application of PCT Application No. PCT/JP2017/036284 filed on Oct. 5, 2017. The entire contents of each of these applications are hereby incorporated herein by reference.

BACKGROUND OF THE INVENTION

1. Field of the Invention

The present invention relates to a filter device including a ladder filter, and to a multiplexer including the filter device.

2. Description of the Related Art

Recent cellular phones are required to be adapted for a plurality of frequency bands and a plurality of radio systems, i.e., the multi-band and multi-mode standards, with one terminal. To meet such a demand, a multiplexer for demultiplexing radio frequency signals having a plurality of radio carrier frequencies is disposed in association with one antenna. A filter device including the multiplexer is required to improve attenuation characteristics outside a pass band, such that radio wave interference with other communication devices will not occur.

Japanese Unexamined Patent Application Publication No. 2012-147175 discloses, as an example of the above-described type of filter device, a filter device including a ladder filter that includes a plurality of serial resonators and a plurality of parallel resonators. In the disclosed filter device, capacitors are connected in parallel to predetermined ones of the serial resonators and the parallel resonators. Furthermore, it is known that an attenuation pole is able to be adjusted, for example, by connecting a capacitor in parallel to the parallel resonator.

In the filter device disclosed in Japanese Unexamined Patent Application Publication No. 2012-147175, however, because there is a limitation on the number of attenuation poles that are able to be formed, attenuation characteristics in a predetermined frequency band other than a pass band is not sufficient, and radio wave interference with other communication devices may occur in some cases.

SUMMARY OF THE INVENTION

Preferred embodiments of the present invention provide filter devices in each of which attenuation characteristics in a predetermined frequency band other than a pass band are able to be improved.

A filter device according to a first preferred embodiment of the present invention includes a first terminal and a second terminal; a first ladder filter including a serial resonator disposed in a terminal-to-terminal path connecting the first terminal and the second terminal, and a parallel resonator disposed in a connection path connecting a predetermined junction point on the terminal-to-terminal path and a ground; a first acoustic wave resonator disposed in parallel to the parallel resonator in the connection path; and a second acoustic wave resonator disposed in parallel to the serial resonator in the terminal-to-terminal path, wherein a resonance point and an anti-resonance point of the first acoustic wave resonator are both positioned on the lower frequency side or the higher frequency side of a pass band of the first ladder filter, and a resonance point and an anti-resonance point of the second acoustic wave resonator are both positioned on the lower frequency side or the higher frequency side of the pass band of the first ladder filter and on the same side as the side in which the resonance point and the anti-resonance point of the first acoustic wave resonator are positioned, when viewed from the pass band of the first ladder filter.

With the above features, an attenuation band is able to be defined by the first acoustic wave resonator and the second acoustic wave resonator on the lower frequency side or the higher frequency side of the pass band of the first ladder filter. Thus, by setting the attenuation band to be overlapped with a predetermined frequency band other of the pass band of the first ladder filter to increase an insertion loss, attenuation characteristics in the predetermined frequency band of the filter device are able to be improved.

In a filter device according to a preferred embodiment of the present invention, a second ladder filter may be defined by the first acoustic wave resonator disposed in the connection path and the second acoustic wave resonator disposed in the terminal-to-terminal path, and a pass suppression band defined by an attenuation pole or an attenuation band of the second ladder filter may be positioned on the lower frequency side or the higher frequency side of the pass band of the first ladder filter.

With the above features, the pass suppression band is able to be defined by the first acoustic wave resonator and the second acoustic wave resonator. By setting the pass suppression band to be overlapped with a predetermined frequency band other of the pass band of the first ladder filter to increase the insertion loss, attenuation characteristics in the predetermined frequency band are able to be improved.

In a filter device according to a preferred embodiment of the present invention, the second ladder filter may be a band pass filter, and the pass suppression band may be defined by the attenuation pole of the second ladder filter.

With the above features, the pass suppression band having a large insertion loss is able to be defined by the attenuation pole of the band pass filter. By setting the pass suppression band to be overlapped with a predetermined frequency band other than the pass band of the first ladder filter to increase the insertion loss, attenuation characteristics in the predetermined frequency band of the filter device are able to be improved.

In a filter device according to a preferred embodiment of the present invention, the second ladder filter may be a band elimination filter, and the pass suppression band may be defined by the attenuation band of the second ladder filter.

With the above features, the pass suppression band having a large insertion loss over a wider band width is able to be defined by the attenuation band of the band elimination filter. By setting the pass suppression band to be overlapped with a predetermined frequency band other than the pass band of the first ladder filter to increase the insertion loss, attenuation characteristics in the predetermined frequency band of the filter device are able to be improved.

In a filter device according to a preferred embodiment of the present invention, the resonance point and the anti-resonance point of each of the first acoustic wave resonator and the second acoustic wave resonator may be positioned on the higher frequency side of the pass band of the first ladder filter.

In the case of setting the resonance point and the anti-resonance point to be positioned on the higher frequency side of the pass band of the first ladder filter as described above, even when excitation efficiency is reduced on the higher frequency side of the anti-resonance point, an influence on the lower frequency side of the anti-resonance point is able to be maintained at a small or negligible level, and thus, a power loss in the pass band of the first filter is able to be reduced or prevented.

In a filter device according to a preferred embodiment of the present invention, each of the first acoustic wave resonator and the second acoustic wave resonator may define and function as a capacitor having a predetermined capacitance in a frequency band different from the resonance point and the anti-resonance point.

By causing each of the first acoustic wave resonator and the second acoustic wave resonator to define and function as a capacitor in the frequency band different from the resonance point and the anti-resonance point thereof as described above, the attenuation band on the lower frequency side of the pass band of the first filter is able to be widened and sharpness on the higher frequency side of the pass band is able to be increased.

In a filter device according to a preferred embodiment of the present invention, the first ladder filter may include a plurality of the serial resonators and a plurality of the parallel resonators, the first acoustic wave resonator may be disposed in parallel to a predetermined one of the parallel resonators, and the second acoustic wave resonator may be disposed in parallel to the serial resonator that is connected to the predetermined parallel resonator via the junction point.

With the above features, a ladder filter is able to be provided by the predetermined parallel resonator and the serial resonator directly connected to the predetermined parallel resonator. As a result, the attenuation band is able to be easily provided, and the attenuation characteristics of the filter ladder device are able to be improved.

A filter device according to a preferred embodiment of the present invention may further include an inductor between the parallel resonator in the connection path and the ground.

With the above feature, a pass band width of the first ladder filter is able to be widened, and a higher attenuation is able to be obtained on the higher frequency side of the pass band.

A multiplexer according to a preferred embodiment of the present invention includes a filter device according to a preferred embodiment of the present invention, a third terminal, and a third filter disposed in a path connecting the first terminal and the third terminal.

With the above feature, the multiplexer is able to be provided in which the attenuation characteristics in the predetermined frequency band other than the pass band are improved, and in which radio wave interference with other communication devices is reduced or prevented.

The filter devices of preferred embodiments of the present invention improve the attenuation characteristics in the predetermined frequency band other than the pass band. Furthermore, the multiplexers according to preferred embodiments of the present invention each including a filter device according to preferred embodiments of the present invention are able to reduce or prevent radio wave interference with other communication devices.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
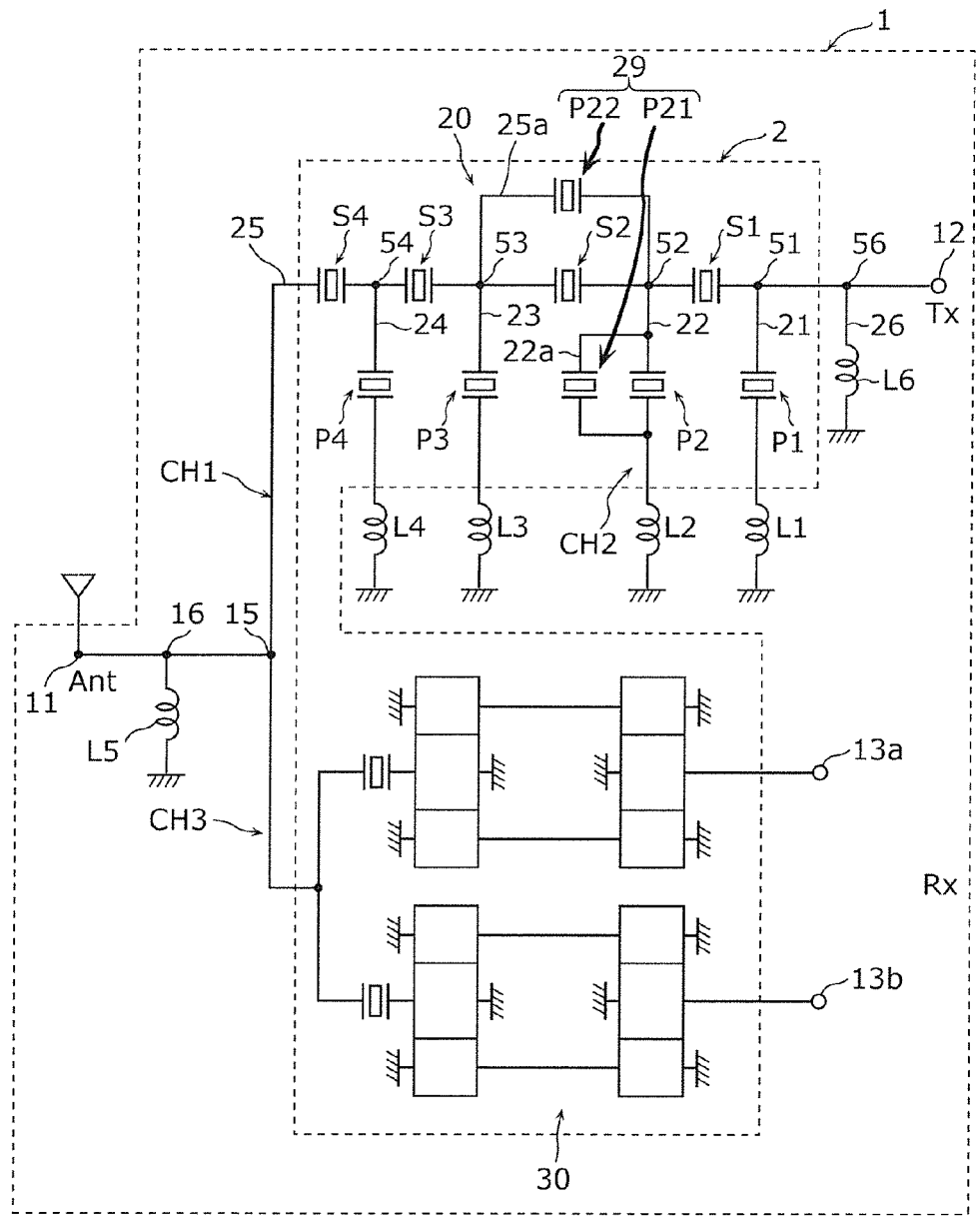
FIG. 1 is a circuit diagram of a multiplexer and a filter device according to a preferred embodiment 1 of the present invention.

Preferred embodiments of the present invention will be described in detail below with reference to examples and drawings. It is to be noted that any of the following preferred embodiments represents a generic or specific example. Numerical values, shapes, materials, elements, arrangements and connection structures of the elements, and other features and elements, which are described in the following preferred embodiments, are merely illustrative, and they are not intended to limit the scope of the present invention. Among the elements in the following preferred embodiments, those not recited in independent claims are explained as optional elements. Sizes or relative size ratios of the elements illustrated in the drawings are not always exactly true in a strict sense.

Preferred Embodiment 1

A multiplexer and a filter device according to a preferred embodiment 1 of the present invention are utilized in communication devices, such as cellular phones, for example. In the present preferred embodiment, the multiplexer is described, by way of example, in connection with a duplexer for Band1 (transmission pass band: about 1920 MHz to about 1980 MHz, reception pass band: about 2110 MHz to about 2170 MHz).

FIG. 1 is a circuit diagram of a multiplexer 1 and a filter device 2 according to the preferred embodiment 1.

The multiplexer 1 includes a first terminal 11 that is an antenna-side terminal, a second terminal 12 that is a transmission-side signal terminal, third terminals 13a and 13b that are reception-side signal terminals, a first filter 20 that is a transmission filter, and a third filter 30 that is a reception filter. The first filter 20 is disposed in a terminal-to-terminal path CH1 connecting the first terminal 11 and the second terminal 12, and the third filter 30 is disposed in a terminal-to-terminal path CH3 connecting the first terminal 11 and each of the third terminals 13a and 13b. The terminal-to-terminal paths CH1 and CH3 are joined together at a junction point 15. The first terminal 11 is connected to an antenna 50.

The filter device 2 of the multiplexer 1 includes the first terminal 11, the second terminal 12, and the first filter 20. The first filter 20 is an unbalanced filter that outputs an unbalanced signal to the first terminal 11. More specifically, the first filter 20 is preferably defined by a ladder filter, for example. A pass band of the first filter 20 is preferably, for example, about 1920 MHz to about 1980 MHz.

The first filter 20 includes serial resonators S1, S2, S3 and S4. The serial resonators S1 to S4 are each disposed in a serial arm 25 that is disposed in the terminal-to-terminal path CH1 between the second terminal 12 and the junction point 15.

The first filter 20 includes parallel resonators P1, P2, P3 and P4. The parallel resonator P1 is disposed in a parallel arm 21 that is connected to a junction point 51 between the second terminal 12 and the serial resonator S1. The parallel resonator P2 is disposed in a parallel arm 22 that is connected to a junction point 52 between the serial resonators S1 and S2. The parallel resonator P3 is disposed in a parallel arm 23 that is connected to a junction point 53 between the serial resonators S2 and S3. The parallel resonator P4 is disposed in a parallel arm 24 that is connected to a junction point 54 between the serial resonators S3 and S4.

The filter device 2 further includes the third terminals 13a and 13b and the third filter 30. The third filter 30 is preferably, for example, a longitudinally coupled resonator acoustic wave filter. The third filter 30 is a balanced filter having the balanced-unbalanced transforming function. Balanced signals are output from the third terminals 13a and 13b.

The multiplexer 1 further includes inductors L1, L2, L3 and L4. The inductors L1 to L4 are disposed in paths connecting the parallel resonators P1 to P4 and a ground, respectively. One-side ends of the inductors L1 to L4 may be joined together and connected to the ground. The inductors L1 to L4 are not always required to be provided. In an alternative example, the inductors L1 to L4 may be defined by inductance components in the parallel resonators P1 to P4, respectively.

The multiplexer 1 further includes inductors L5 and L6 that provide impedance matching. The inductor L5 is disposed between a junction point 16 and the ground, the junction point 16 being positioned between the junction point 15 and the first terminal 11. The inductor L6 is disposed between a junction point 56 and the ground, the junction point 56 being positioned between the junction point 51 and the second terminal 12.

The filter device 2 according to the present preferred embodiment includes a first acoustic wave resonator P21 and a second acoustic wave resonator P22.

The first acoustic wave resonator P21 is connected in parallel to the parallel resonator P2 disposed in the parallel arm 22. More specifically, a parallel arm 22a is disposed in parallel to the parallel arm 22 in a connection path CH2 connecting the junction point 52 on the terminal-to-terminal path CH1 and the ground. The first acoustic wave resonator P21 is disposed in the parallel arm 22a.

The second acoustic wave resonator P22 is connected in parallel to the serial resonator S2 disposed in the serial arm 25. More specifically, a serial arm 22a is disposed in parallel to the serial arm 25 between the junction points 52 and 53 on the terminal-to-terminal path CH1. The second acoustic wave resonator P22 is disposed in the serial arm 25a.

In other words, the first acoustic wave resonator P21 and the second acoustic wave resonator P22 are connected in a ladder configuration, and define a second filter 29 defining and functioning as a band pass filter. The advantageous effects obtained with the first acoustic wave resonator P21 and the second acoustic wave resonator P22 will be described later.

The first acoustic wave resonator P21 and the second acoustic wave resonator P22 each include an IDT (Inter-Digital Transducer).

Figure 2:
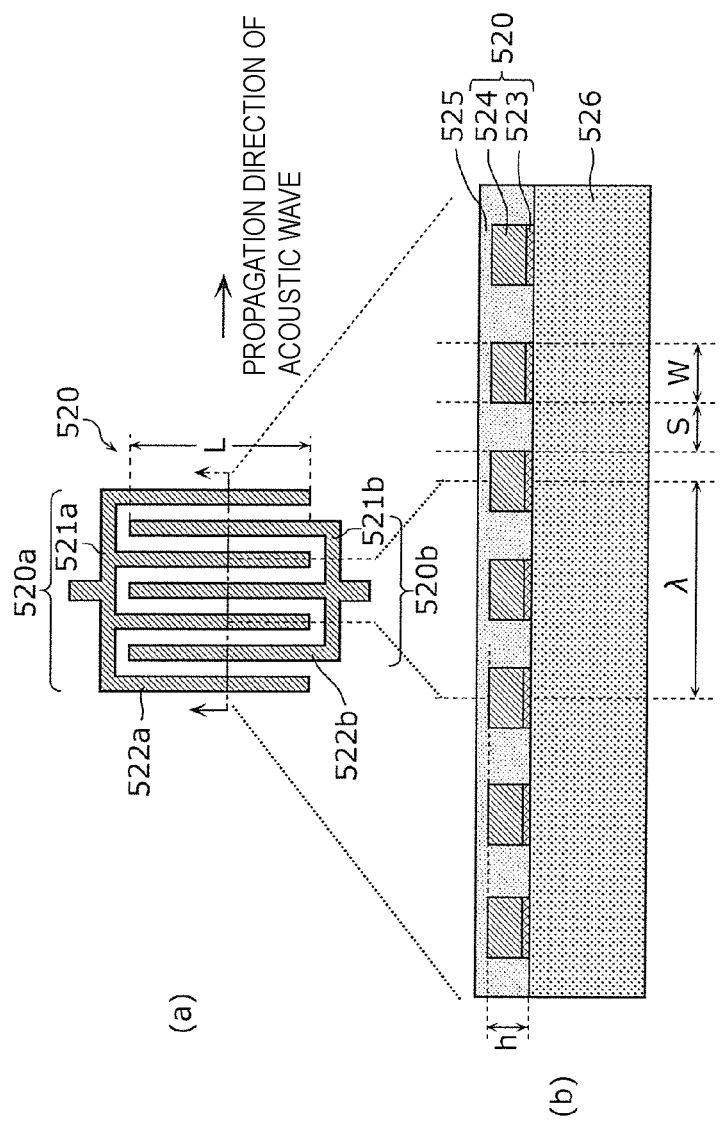
FIG. 2 schematically illustrates an IDT portion of an acoustic wave resonators in the filter device according to the preferred embodiment 1 of the present invention; specifically, part (a) of FIG. 2 is a plan view, and part (b) of FIG. 2 is a sectional view.

FIG. 2 schematically illustrates an IDT portion 520 in each of the acoustic wave resonators P21 and P22. More specifically, part (a) of FIG. 2 is a plan view, and part (b) of FIG. 2 is a sectional view. It is to be noted that the IDT portion 520 is provided to explain a typical structure of an acoustic wave filter, and that the number and lengths of electrode fingers defining the electrode are not limited to those illustrated.

The IDT portion 520 includes IDT electrodes 520a and 520b each having a comb shape. As illustrated in part (a) of FIG. 2, one set of the IDT electrodes 520a and 520b opposing each other is provided on a piezoelectric substrate 526. The IDT electrode 520a includes a plurality of electrode fingers 522a parallel or substantially parallel to one another, and a busbar electrode 521a interconnecting the electrode fingers 522a. The IDT electrode 520b includes a plurality of electrode fingers 522b parallel or substantially parallel to one another, and a busbar electrode 521b interconnecting the electrode fingers 522b. The electrode fingers 522a and 522b extend along a direction perpendicular or substantially perpendicular to a propagation direction of an acoustic wave. In other words, the electrode fingers 522a and 522b are side by side in the propagation direction of the acoustic wave.

As illustrated in part (b) of FIG. 2, each of the IDT electrodes 520a and 520b has a multilayer structure including a close contact layer 523 and a main electrode layer 524. For example, the close contact layer 523 is preferably made of Ti, and the main electrode layer 524 is preferably made of Al containing about 1% of Cu. A protective layer 525 is a film preferably containing, for example, silicon dioxide as a main component and covers the IDT electrodes 520a and 520b. The piezoelectric substrate 526 is preferably made of, for example, a $LiTaO_3$ piezoelectric single crystal, a $LiNbO_3$ piezoelectric single crystal, or a piezoelectric ceramic each of which has predetermined Cut-Angles.

The repetition pitch of the electrode fingers 522a and 522b is denoted by λ, the length of the electrode fingers overlapping with one another when viewing the electrode fingers 522a and the electrode fingers 522b from the propagation direction of the acoustic wave is denoted by an intersecting width L, the height of the electrode fingers 522a and 522b is denoted by h, and the number of pairs of the electrode fingers 522a and 522b is denoted by n. Furthermore, the line width of the electrode fingers 522a and 522b is denoted by W and the space width between adjacent two of the electrode fingers 522a and the electrode fingers 522b is denoted by S, W/(W+S) is defined as a duty ratio D. In this case, resonance points (resonant frequencies) and anti-resonance points (anti-resonant frequencies) of the acoustic wave resonators P21 and P22 are determined depending on the pitch λ and the duty ratio D.

Moreover, capacitances of the acoustic wave resonators P21 and P22 are determined depending on the intersecting width L, the height h, the number of pairs n, the pitch λ, and the duty ratio D. Those capacitances represent capacitances when the acoustic wave resonators P21 and P22 define and function as capacitors in frequency bands other than the resonance points and the anti-resonance points. The advantageous effects obtained when the acoustic wave resonators P21 and P22 define and function as capacitors will be described later.

Advantageous effects obtained with the filter device 2 according to the preferred embodiment 1 will be described below in comparison with a filter device 102 according to a Comparative Example 1.

Figure 3:
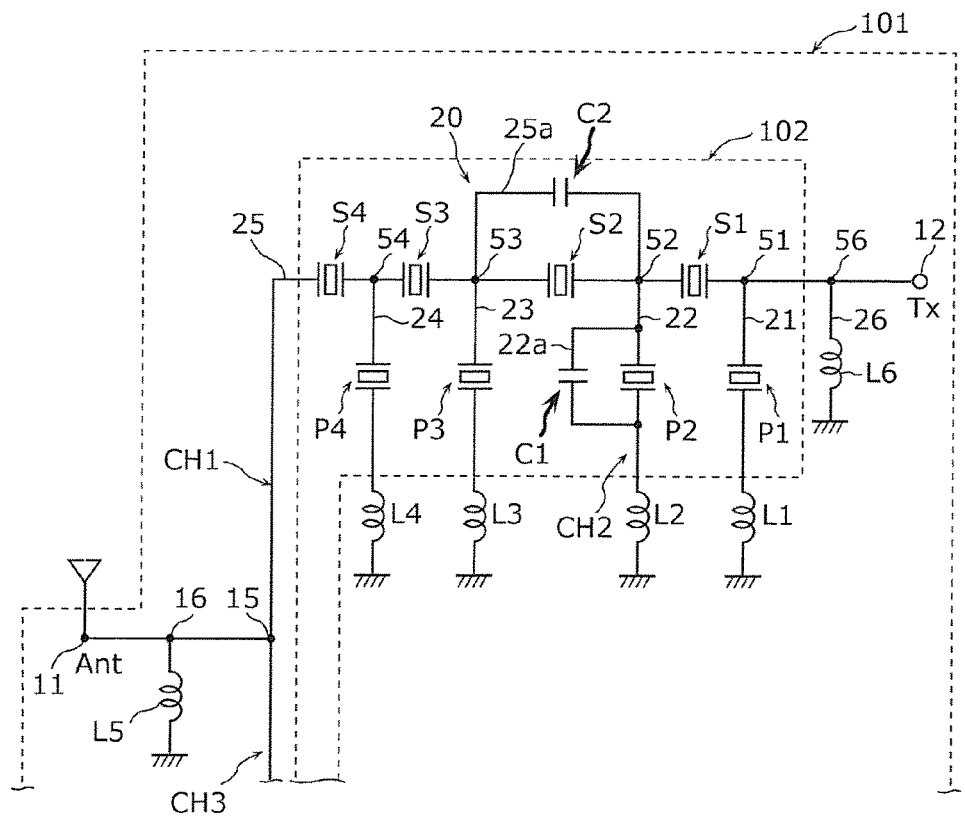
FIG. 3 is a circuit diagram of a filter device according to a Comparative Example 1.

FIG. 3 is a circuit diagram of the filter device 102 according to the Comparative Example 1. The third filter 30 is similar to that in the filter device 2, and description of the third filter 30 is omitted.

The filter device 102 (and a multiplexer 101) according to the Comparative Example 1 has a circuit configuration in which the first acoustic wave resonator P21 of the filter device 2 is replaced with a capacitor C1 and the second acoustic wave resonator P22 is replaced with a capacitor C2. Thus, in the filter device 102, the capacitor C1 is connected in parallel (i.e., in a bridging relation) to the parallel resonator P2, and the capacitor C2 is connected in parallel to the serial resonator S2.

Figure 4:
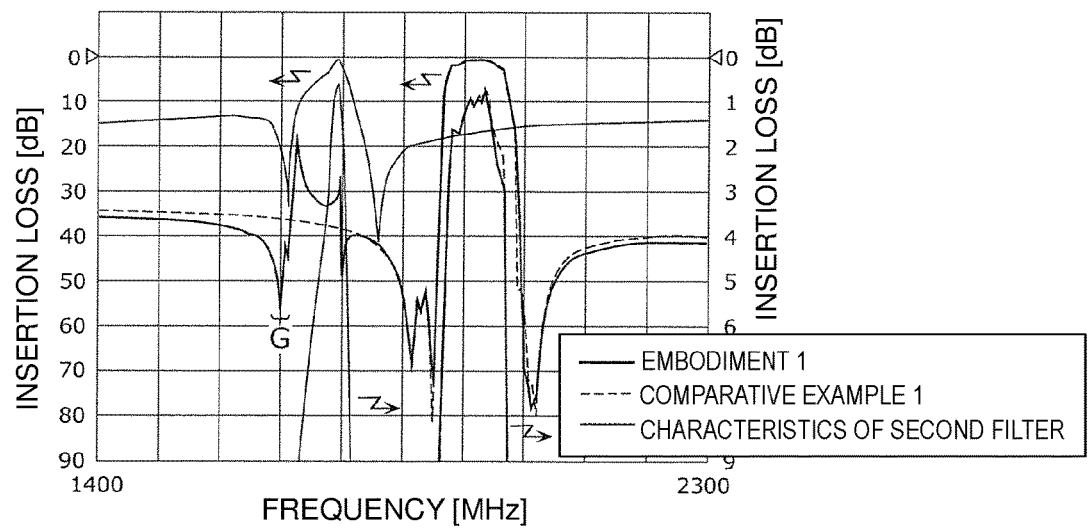
FIG. 4 is a graph depicting frequency characteristics of filter devices according to the preferred embodiment 1 of the present invention and the Comparative Example 1, and frequency characteristics of a second filter.

FIG. 4 is a graph depicting frequency characteristics of the filter devices 2 and 102 according to the preferred embodiment 1 and the Comparative Example 1, and frequency characteristics of the second filter 29.

As seen in FIG. 4, in the filter device 102 according to the Comparative Example 1, the insertion loss near a 1.7 GHz band, for example, is about 36 dB, and sufficient attenuation characteristics are not obtained. In contrast, in the filter device 2 according to the preferred embodiment 1, a pass suppression band G of the second filter 29 is present near the 1.7 GHz band, and the insertion loss is about 56 dB.

The mechanism causing the attenuation characteristics outside the pass band of the first filter 20 to be improved with the presence of the pass suppression band G of the second filter 29 will be described below.

In the filter device 2 according to the preferred embodiment 1, a resonance point fr1 and an anti-resonance point fa1 of the first acoustic wave resonator P21 are both positioned on the lower frequency side of the pass band of the first filter 20. A frequency at the resonance point fr1 of the first acoustic wave resonator P21 is lower than that at the anti-resonance point fa1 thereof. A resonance point fr2 and an anti-resonance point fa2 of the second acoustic wave resonator P22 are both positioned on the lower frequency side of the pass band of the first filter 20. A frequency at the resonance point fr2 of the second acoustic wave resonator P22 is lower than that at the anti-resonance point fa2 thereof.

By setting the acoustic wave resonators P21 and P22 so as to satisfy fa1≈fr2 and fr1<fa2 (e.g., fr1=about 1693.84 MHz, fa1=about 1750.39 MHz, fr2=about 1753.33 MHz, and fa2=about 1811.96 MHz), the second filter 29 including the acoustic wave resonators P21 and P22 defines and functions as a band pass filter as represented by a thin line in FIG. 4. A band defined by an attenuation pole of the second filter 29 provides the above-described pass suppression band G.

The insertion loss in a predetermined frequency band is increased by setting one of two attenuation poles of the second filter 29, i.e., the pass suppression band G positioned on the lower frequency side, to be overlapped with the predetermined frequency band. For instance, by setting the pass suppression band G to be overlapped with the 1.7 GHz band as depicted in FIG. 4, the insertion loss near the 1.7 GHz band is increased, and the attenuation characteristics are improved.

Thus, in the present preferred embodiment, the attenuation characteristics in a predetermined frequency band in which the insertion loss is to be increased are able to be improved by setting the pass suppression band G of the second filter 29, which includes the acoustic wave resonators P21 and P22, to be overlapped with the predetermined frequency band.

Although, in FIG. 4, one of the two attenuation poles of the second filter 29, i.e., the pass suppression band G positioned on the lower frequency side, is preferably set to be overlapped with the predetermined frequency band, the present invention is not limited to this case. Alternatively, a pass suppression band positioned on the higher frequency side may be overlapped with the predetermined frequency band.

When a frequency band in which the attenuation characteristics are to be improved is present on the higher frequency side of the pass band of the first filter 20, the second filter 29 is provided on the higher frequency side preferably by setting, for example, all of the resonance point fr1, the anti-resonance point fa1, the resonance point fr2, and the anti-resonance point fa2 to be positioned on the higher frequency side of the pass band of the first filter 20. Furthermore, the pass suppression band G of the second filter 29, which is positioned on the higher frequency side, is preferably set to be overlapped with a band in which the insertion loss is to be increased. As a result, the attenuation characteristics in the predetermined frequency band are able to be improved.

In the case of setting the resonance points fr1 and fr2 and the anti-resonance points fa1 and fa2 to be positioned on the higher frequency side of the pass band of the first filter 20 as described above, even when excitation efficiency is reduced on the higher frequency side of the anti-resonance points, an influence on the lower frequency side of the anti-resonance points is able to be held small, and thus, a power loss (power consumption) in the pass band of the first filter 20 is able to be reduced or prevented.

The filter device 2 according to the present preferred embodiment includes the first terminal 11 and the second terminal 12, the first ladder filter 20 including the serial resonators S1 to S4 disposed in the terminal-to-terminal path CH1 connecting the first terminal 11 and the second terminal 12, and the parallel resonators P1 to P4 disposed in the connection paths CH2 connecting the predetermined junction points 51 to 54 on the terminal-to-terminal path CH1 and the ground, the first acoustic wave resonator P21 disposed in parallel to the parallel resonator P2 in the connection path CH2, and the second acoustic wave resonator P22 disposed in parallel to the serial resonator S2 in the terminal-to-terminal path CH1. The resonance point fr1 and the anti-resonance point fa1 of the first acoustic wave resonator P21 are both positioned on the lower frequency side or the higher frequency side of the pass band of the first filter 20. The resonance point fr2 and the anti-resonance point fa2 of the second acoustic wave resonator P22 are both positioned on the lower frequency side or the higher frequency side of the pass band of the first filter 20, and on the same side as the side at which the resonance point fr1 and the anti-resonance point fa1 of the first acoustic wave resonator P21 are positioned, when viewed from the pass band of the first filter 20.

With the above-described configuration, the attenuation band is able to be defined by the acoustic wave resonators P21 and P22 on the lower frequency side or the higher frequency side of the pass band of the first filter 20. Thus, by setting the attenuation band to be overlapped with a predetermined frequency band other than the pass band of the first filter 20 to increase the insertion loss, the attenuation characteristics in the predetermined frequency band is able to be improved.

In the present preferred embodiment, the first acoustic wave resonator P21 is disposed in parallel to the predetermined parallel resonator P2, and the second acoustic wave resonator P22 is disposed in parallel to the serial resonator S2 that is connected to the predetermined parallel resonator P2 via the junction point 52. However, the present preferred embodiment is not limited to such a case, and the first acoustic wave resonator P21 may be connected in parallel to the parallel resonator P1, P3 or P4. The second acoustic wave resonator P22 may be connected in parallel to the serial resonator S1, S3 or S4. Even in this case, the attenuation characteristics outside the pass band of the first filter 20 are able to be improved as in the above-described case.

Other advantageous effects of the filter device 2 according to the preferred embodiment 1 will be described below with reference to Comparative Examples 1, 2 and 3.

In the filter device 102 according to the Comparative Example 1, as illustrated in FIG. 3 described above, the capacitor C1 is connected in parallel to the parallel resonator P2, and the capacitor C2 is connected in parallel to the serial resonator S2.

Figure 5:
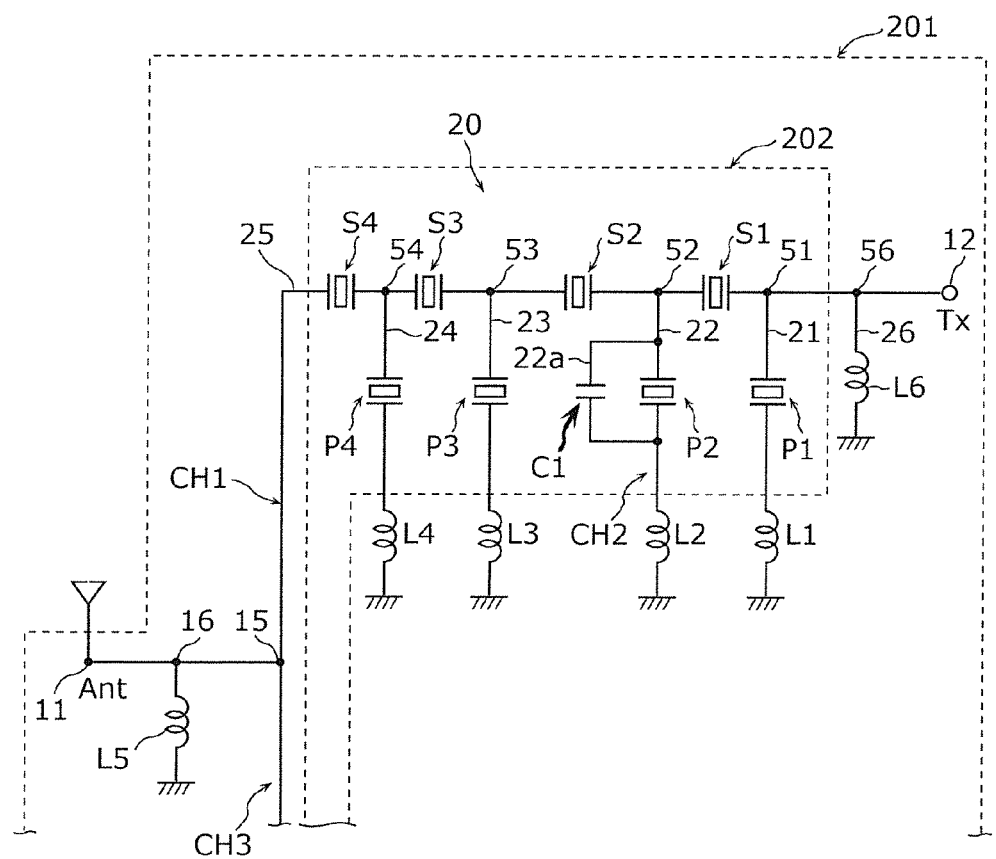
FIG. 5 is a circuit diagram of a filter device according to a Comparative Example 2.
Figure 6:
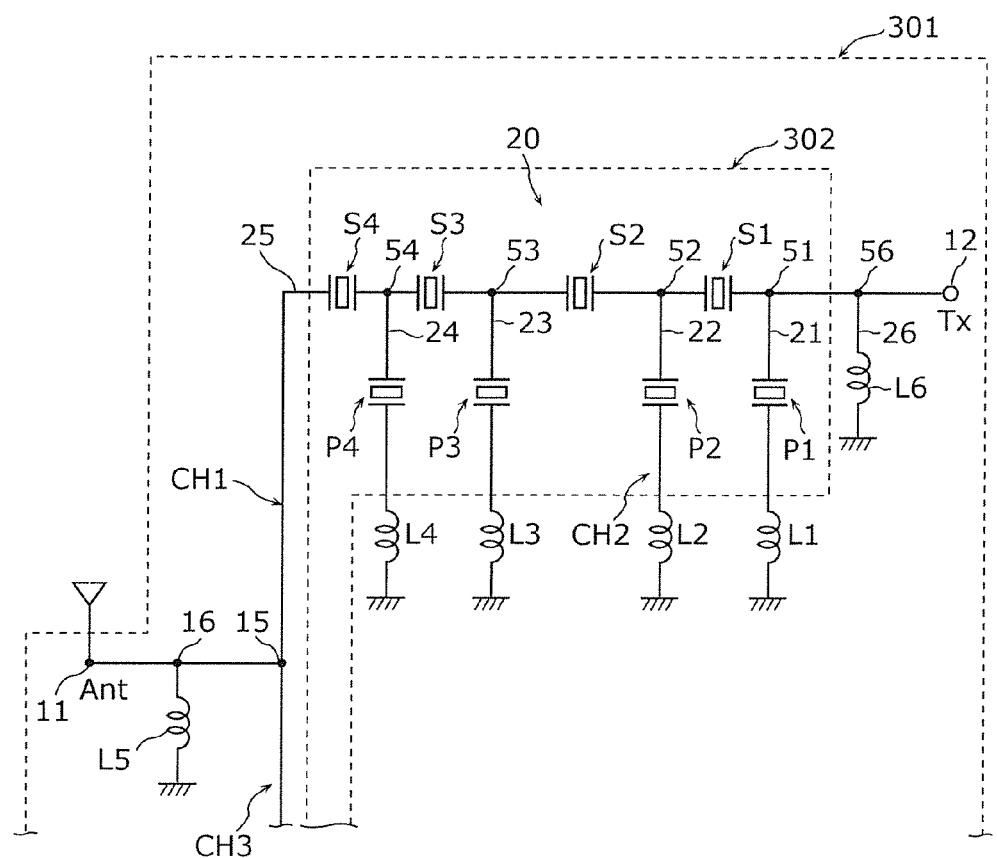
FIG. 6 is a circuit diagram of a filter device according to a Comparative Example 3.

FIG. 5 is a circuit diagram of a filter device 202 according to a Comparative Example 2. FIG. 6 is a circuit diagram of a filter device 302 according to a Comparative Example 3.

The filter device 202 (and a multiplexer 201) according to the Comparative Example 2 has a circuit configuration in which the capacitor C2 is removed from the filter device 102 according to the Comparative Example 1, as illustrated in FIG. 5. Thus, in the filter device 202, the capacitor C2 is not provided, and only the capacitor C1 is connected in parallel to the parallel resonator P2.

The filter device 302 (and a multiplexer 301) according to the Comparative Example 3 has a circuit configuration in which the capacitor C1 and the capacitor C2 are removed from the filter device 102 according to the Comparative Example 1, as illustrated in FIG. 6. Thus, the filter device 302 does not include the capacitors C1 and C2.

Figure 7A:
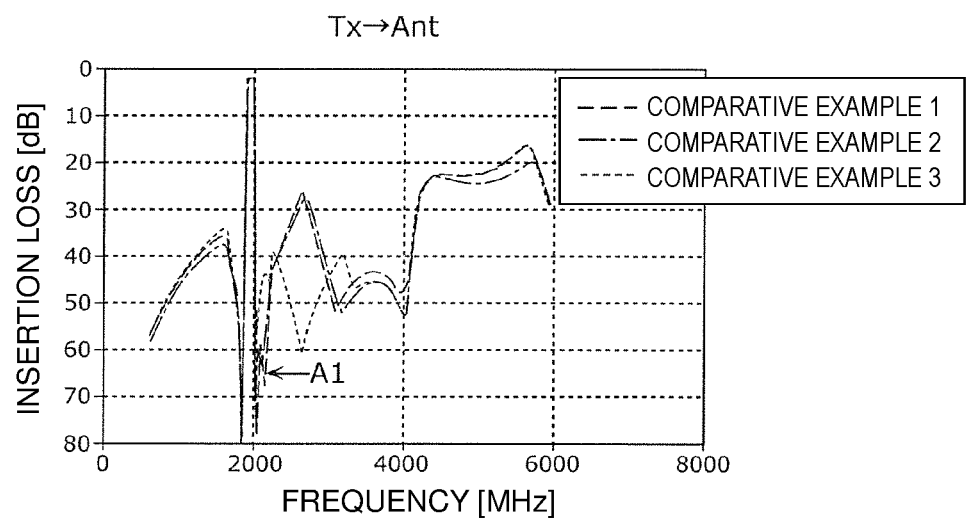
FIG. 7A is a graph depicting frequency characteristics of the filter devices according to the Comparative Examples 1 to 3.
Figure 7B:
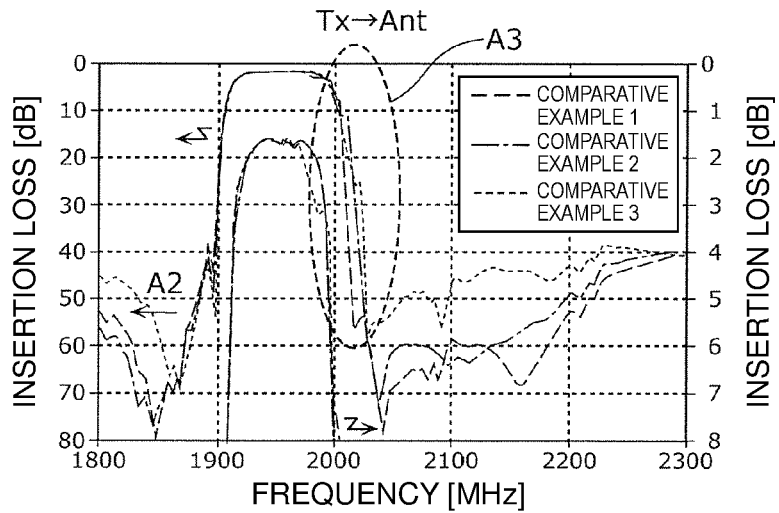
FIG. 7B is a graph depicting a portion of FIG. 7A with a horizontal axis (frequency) represented in an enlarged scale.

The advantageous effects obtained by providing the capacitors C1 and C2 in the filter device 2 will be described below with reference to FIGS. 7A and 7B. FIG. 7A is a graph depicting frequency characteristics of the filter devices 102, 202 and 302 according to the Comparative Examples 1 to 3. FIG. 7B is a graph depicting a portion of FIG. 7A with a horizontal axis (frequency) represented in an enlarged scale.

The advantageous effects obtained by providing the capacitor C1 are first described with reference to the Comparative Examples 2 and 3.

The Comparative Example 2 has the configuration in which the capacitor C1 is connected in parallel to the parallel resonator P2 in the Comparative Example 3. Therefore, the capacitance connected to the inductor L2 is increased from that in the Comparative Example 3, and a sub-resonance point (i.e., a frequency at which resonance occurs due to harmonics) positioned on the higher frequency side of the pass band is shifted toward the lower frequency side (as denoted by arrow A1 in FIG. 7A). As a result, the insertion loss outside (on the higher frequency side of) the pass band of the first filter 20 is increased and the attenuation characteristics are improved.

Furthermore, in the Comparative Example 2, since the capacitance connected to the inductor L2 is increased from that in the Comparative Example 3, the resonance point of the parallel resonator P2 connected to the inductor L2 is shifted toward the lower frequency side (as denoted by arrow A2 in FIG. 7B). As a result, a band which is positioned outside (on the lower frequency side of) the pass band of the first filter 20 and in which the insertion loss is large is widened, and the attenuation characteristics are improved.

Next, the advantageous effects obtained by providing the capacitor C2 are described with reference to the Comparative Examples 1 and 2.

The Comparative Example 1 has the configuration in which the capacitor C2 is connected in parallel to the serial resonator S2 in the Comparative Example 2. Therefore, the capacitance connected to the serial resonator S2 is increased from that in the Comparative Example 2, and the anti-resonance point of the serial resonator S2 is shifted toward the lower frequency side. As a result, sharpness on the higher frequency side of the pass band of the first filter 20 is increased (as denoted by arrow A3 in FIG. 7B) and the attenuation characteristics are improved. Between frequencies of about 1995 MHz and about 2007 MHz, for example, an increase amount of the insertion loss in the Comparative Example 2 is about 6.86 dB, while an increase amount of the insertion loss in the Comparative Example 1 is about 8.85 dB. Thus, sharpness is increased.

Next, the advantageous effects obtained with the filter device 2 are described with reference to the preferred embodiment 1 and the Comparative Example 1.

Figure 8A:
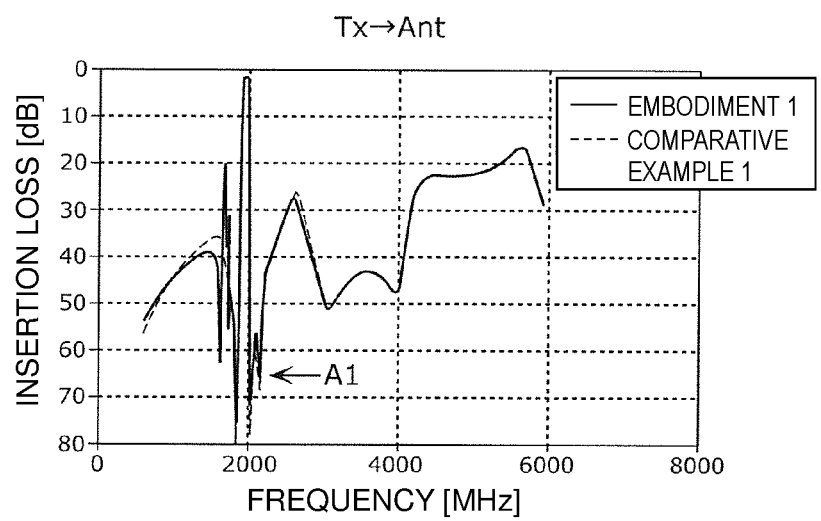
FIG. 8A is a graph depicting the frequency characteristics of the filter devices according to the preferred embodiment 1 of the present invention and the Comparative Example 1.
Figure 8B:
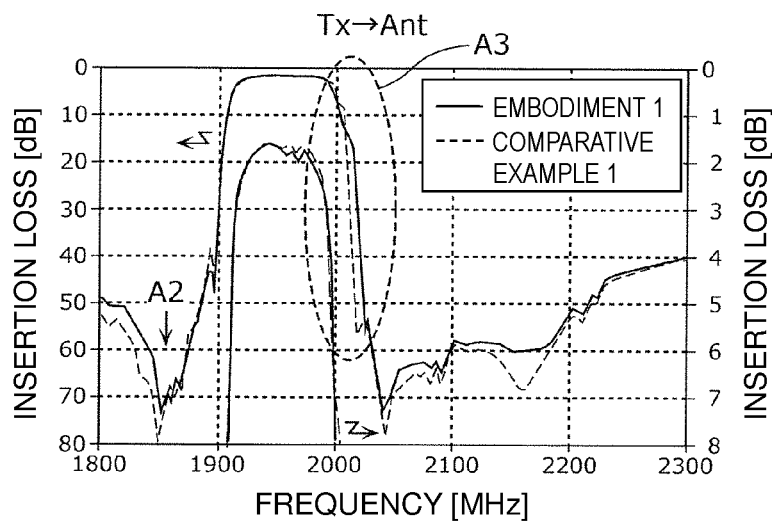
FIG. 8B is a graph depicting a portion of FIG. 8A with a horizontal axis (frequency) represented in an enlarged scale.

FIG. 8A is a graph depicting the frequency characteristics of the filter devices 2 and 102 according to the preferred embodiment 1 and the Comparative Example 1. FIG. 8B is a graph depicting a portion of FIG. 8A with a horizontal axis (frequency) represented in an enlarged scale.

As described above, the filter device 2 includes the first acoustic wave resonator P21 and the second acoustic wave resonator P22. Each of the acoustic wave resonators P21 and P22 defines and functions as a capacitor having a predetermined capacitance in a frequency band different from the resonance point and the anti-resonance point. More specifically, in the present preferred embodiment, the first acoustic wave resonator P21 is preferably designed to have the same or substantially the same capacitance as that of the capacitor C1 in frequency bands lower than the resonance point and higher than the anti-resonance point thereof. The second acoustic wave resonator P22 is preferably designed to have the same or substantially the same capacitance as that of the capacitor C2 in frequency bands lower than the resonance point and higher than the anti-resonance point thereof. Accordingly, the acoustic wave resonators P21 and P22 define and function respectively as the capacitors C1 and C2 in the pass band of the first filter 20, which is different from the resonance points and the anti-resonance points of the acoustic wave resonators P21 and P22. Thus, the filter device 2 has similar characteristics to those in the Comparative Example 1 in the above-described bands denoted by arrows A1, A2 and A3.

More specifically, in the filter device 2, as depicted in FIG. 8A, the sub-resonance point positioned on the higher frequency side of the pass band is shifted toward the lower frequency side (as denoted by arrow A1 in FIG. 8A). As a result, the insertion loss outside (on the higher frequency side of) the pass band of the first filter 20 is increased and the attenuation characteristics are improved. Furthermore, as depicted in FIG. 8B, the resonance point of the parallel resonator P2 is shifted toward the lower frequency side (as denoted by arrow A2 in FIG. 8B). As a result, the band which is positioned outside (on the lower frequency side of) the pass band of the first filter 20 and in which the insertion loss is large is widened, and the attenuation characteristics are improved. In addition, as depicted in FIG. 8B, the anti-resonance point of the serial resonator S2 is shifted toward the lower frequency side, and sharpness on the higher frequency side of the pass band of the first filter 20 is increased (as denoted by arrow A3 in FIG. 8B). Between frequencies of about 1995 MHz and about 2007 MHz, for example, an increase amount of the insertion loss is about 9.00 dB. Thus, sharpness is increased as in the Comparative Example 1.

Stated in another way, the filter device 2 according to the present preferred embodiment not only provides similar advantageous effects to those obtained in the Comparative Example 1 in the frequency band different from the resonance points and the anti-resonance points of the acoustic wave resonators P21 and P22, but also increases the insertion loss and improves the attenuation characteristics in the predetermined frequency band other than the pass band of the first filter 20.

Preferred Embodiment 2

A filter device 2 according to a preferred embodiment 2 of the present invention will be described below. In this filter device 2, the second filter 29 is a band elimination filter. A circuit configuration of the filter device 2 according to the preferred embodiment 2 is similar to that in the preferred embodiment 1, and detailed description of the circuit configuration is omitted.

Figure 9:
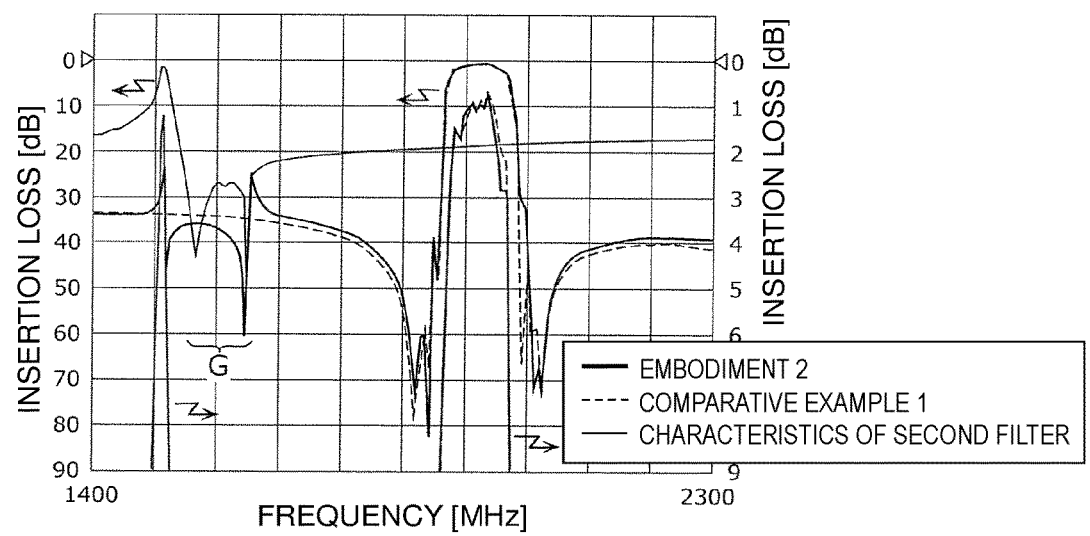
FIG. 9 is a graph depicting frequency characteristics of the filter devices according to a preferred embodiment 2 of the present invention and the Comparative Example 1, and the frequency characteristics of the second filter.

FIG. 9 is a graph depicting frequency characteristics of the filter devices 2 and 102 according to the preferred embodiment 2 and the Comparative Example 1, and frequency characteristics of the second filter 29.

As illustrated in FIG. 9, in the filter device 102 according to the Comparative Example 1, the insertion loss in a range of not lower than about 1.55 GHz and not higher than about 1.65 GHz, for example, is about 35 dB, and sufficient attenuation characteristics are not obtained. In contrast, in the filter device 2 according to the preferred embodiment 2, the pass suppression band G of the second filter 29 is present in the range of not lower than about 1.55 GHz and not higher than about 1.65 GHz, and the insertion loss is about 60 dB.

In the filter device 2 according to the preferred embodiment 2, the resonance point fr1 and the anti-resonance point fa1 of the first acoustic wave resonator P21 are both positioned on the lower frequency side of the pass band of the first filter 20. The frequency at the resonance point fr1 of the first acoustic wave resonator P21 is lower than that at the anti-resonance point fa1 thereof. The resonance point fr2 and the anti-resonance point fa2 of the second acoustic wave resonator P22 are both positioned on the lower frequency side of the pass band of the first filter 20. The frequency at the resonance point fr2 of the second acoustic wave resonator P22 is lower than that at the anti-resonance point fa2 thereof.

By setting the acoustic wave resonators P21 and P22 so as to satisfy fa2<fr1 (e.g., fr1=about 1627.6 MHz, fa1=about 1681.5 MHz, fr2=about 1501.5 MHz, and fa2=about 1548.3 MHz), the second filter 29 including the acoustic wave resonators P21 and P22 defines and functions as a band elimination filter as represented by a thin line in FIG. 9. A band defined by an attenuation band of the second filter 29 provides the above-described pass suppression band G.

The insertion loss in a predetermined frequency band is increased by setting the pass suppression band G of the second filter 29 to be overlapped with the predetermined frequency band. For instance, by setting the pass suppression band G to be overlapped with the range of about 1.55 GH to about 1.65 GHz as depicted in FIG. 9, the insertion loss in the range of about 1.55 GHz to about 1.65 GHz is increased, and the attenuation characteristics are improved.

Thus, in the preferred embodiment 2, the attenuation characteristics in a predetermined frequency band in which the insertion loss is to be increased is able to be improved by setting the pass suppression band G of the second filter 29, which includes the acoustic wave resonators P21 and P22, to be overlapped with the predetermined frequency band.

Figure 10A:
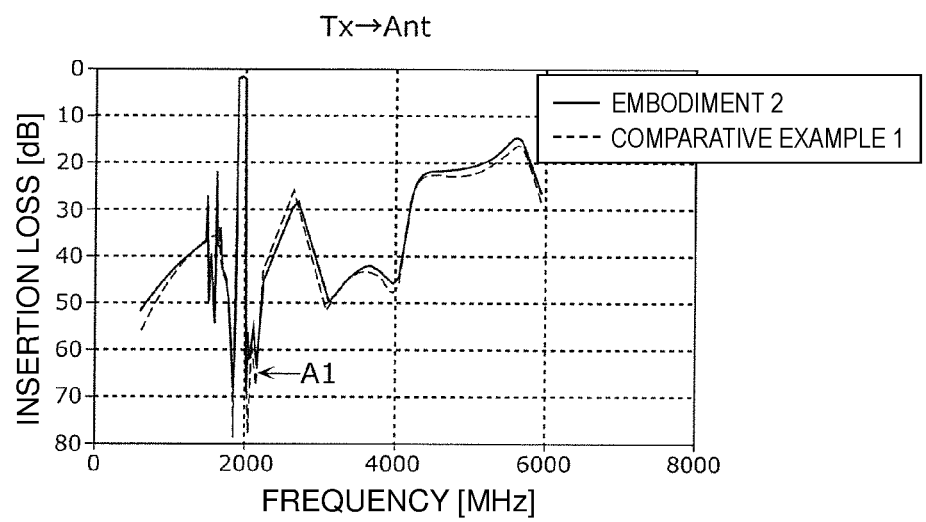
FIG. 10A is a graph depicting the frequency characteristics of the filter devices according to the preferred embodiment 2 of the present invention and the Comparative Example 1.
Figure 10B:
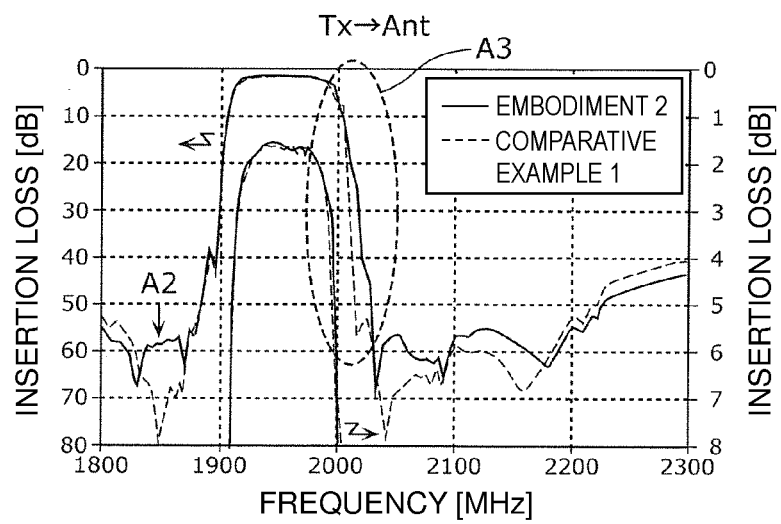
FIG. 10B is a graph depicting a portion of FIG. 10A with a horizontal axis (frequency) represented in an enlarged scale.

FIG. 10A is a graph depicting the frequency characteristics of the filter devices 2 and 102 according to the preferred embodiment 2 and the Comparative Example 1. FIG. 10B is a graph depicting a portion of FIG. 10A with a horizontal axis (frequency) represented in an enlarged scale.

Also in the filter device 2 according to the preferred embodiment 2, the acoustic wave resonators P21 and P22 define and function respectively as the capacitors C1 and C2 in the pass band of the first filter 20, which is different from the resonance points and the anti-resonance points of the acoustic wave resonators P21 and P22. Thus, the filter device 2 has similar characteristics to those in the Comparative Example 1.

Stated in another way, the filter device 2 according to the preferred embodiment 2 not only provides similar advantageous effects to those obtained in the Comparative Example 1 in the frequency band different from the resonance points and the anti-resonance points of the acoustic wave resonators P21 and P22, but also increases the insertion loss and improves the attenuation characteristics in the predetermined frequency band other than the pass band of the first filter 20.

Although the filter devices 2 and the multiplexers 1 according to the preferred embodiments of the present invention have been described above, the present invention is not limited to the above-described preferred embodiments. For instance, preferred embodiments resulting from modifying the above-described preferred embodiments as described below also fall within the scope of the present invention.

Although the above description has been made, by way of example, on an assumption that a frequency band in which the attenuation characteristics are to be improved is in the vicinity of the 1.7 GHz band in the preferred embodiment 1 and the range of not lower than about 1.55 GHz and not higher than about 1.65 GHz in the preferred embodiment 2, the present invention is not limited to these cases. The preferred embodiments may be applied to a GPS (Global positioning system) band for which the frequency band at which the attenuation characteristics are to be improved is in a frequency band of about 1.5 GHz.

Although the preferred embodiments have been described, by way of example, in connection with the case in which the first acoustic wave resonator P21 is connected in parallel to the parallel resonator P2, the present invention is not limited to this case. The first acoustic wave resonator P21 may be connected in parallel to both of the parallel resonator P2 and the inductor L2.

When the third filter 30 is, by way of example, a ladder filter, preferred embodiments of the present invention may be applied to the third filter 30.

As another example, the acoustic wave resonator is not limited to a surface acoustic wave resonator, and it may be a boundary acoustic wave resonator.

Although the preferred embodiments have been described, by way of example, in connection with the case in which the multiplexer is a duplexer, the multiplexer may be a multiplexer including a plurality of transmission filters disposed as a group, or a plurality of reception filters disposed as a group.

Preferred embodiments of the present invention may be implemented as a filter device and a multiplexer each adaptable for multi-band and multi-mode frequency standards, and may be widely utilized in communication devices, such as cellular phones, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
   a first terminal;
   a second terminal;
   a first ladder filter including a serial resonator disposed in a terminal-to-terminal path connecting the first terminal and the second terminal, and a parallel resonator disposed in a connection path connecting a predetermined junction point on the terminal-to-terminal path and a ground;
   a first acoustic wave resonator disposed in parallel to the parallel resonator in the connection path; and
   a second acoustic wave resonator disposed in parallel to the serial resonator in the terminal-to-terminal path; wherein
   a resonance point and an anti-resonance point of the first acoustic wave resonator are both positioned on a lower frequency side or a higher frequency side of a pass band of the first ladder filter; and
   a resonance point and an anti-resonance point of the second acoustic wave resonator are both positioned on the lower frequency side or the higher frequency side of the pass band of the first ladder filter and on a same side as the side on which the resonance point and the anti-resonance point of the first acoustic wave resonator are positioned, when viewed from the pass band of the first ladder filter.

2. The filter device according to claim 1, wherein a second ladder filter is defined by the first acoustic wave resonator disposed in the connection path and the second acoustic wave resonator disposed in the terminal-to-terminal path; and
   a pass suppression band defined by an attenuation pole or an attenuation band of the second ladder filter is positioned on the lower frequency side or the higher frequency side of the pass band of the first ladder filter.

3. The filter device according to claim 2, wherein
   the second ladder filter is a band pass filter; and
   the pass suppression band is defined by the attenuation pole of the second ladder filter.

4. The filter device according to claim 2, wherein
   the second ladder filter is a band elimination filter; and
   the pass suppression band is defined by the attenuation band of the second ladder filter.

5. The filter device according to claim 1, wherein the resonance point and the anti-resonance point of each of the first acoustic wave resonator and the second acoustic wave resonator are positioned on the higher frequency side of the pass band of the first ladder filter.

6. The filter device according to claim 1, wherein each of the first acoustic wave resonator and the second acoustic wave resonator define and functions as a capacitor having a predetermined capacitance in a frequency band different from the resonance point and the anti-resonance point.

7. The filter device according to claim 1, wherein
   the first ladder filter includes a plurality of the serial resonators and a plurality of the parallel resonators;
   the first acoustic wave resonator is disposed in parallel to a predetermined one of the plurality of parallel resonators; and
   the second acoustic wave resonator is disposed in parallel to the serial resonator that is connected to the predetermined parallel resonator via the junction point.

8. The filter device according to claim 1, further comprising an inductor between the parallel resonator in the connection path and the ground.

9. The filter device according to claim 1, wherein
   each of the first and second acoustic wave resonators includes an interdigital transducer electrode; and
   the interdigital transducer electrode has a multilayer structure including a close contact layer and a main electrode layer.

10. The filter device according to claim 9, wherein the close contact layer is made of Ti, and the main electrode layer is made of Al containing about 1% of Cu.

11. A multiplexer comprising:
    the filter device according to claim 1;
    a third terminal; and
    a third filter disposed in a path connecting the first terminal and the third terminal.

12. The multiplexer according to claim 11, wherein a second ladder filter is defined by the first acoustic wave resonator disposed in the connection path and the second acoustic wave resonator disposed in the terminal-to-terminal path; and
    a pass suppression band defined by an attenuation pole or an attenuation band of the second ladder filter is positioned on the lower frequency side or the higher frequency side of the pass band of the first ladder filter.

13. The multiplexer according to claim 12, wherein
    the second ladder filter is a band pass filter; and
    the pass suppression band is defined by the attenuation pole of the second ladder filter.

14. The multiplexer according to claim 12, wherein
    the second ladder filter is a band elimination filter; and
    the pass suppression band is defined by the attenuation band of the second ladder filter.

15. The multiplexer according to claim 11, wherein the resonance point and the anti-resonance point of each of the first acoustic wave resonator and the second acoustic wave resonator are positioned on the higher frequency side of the pass band of the first ladder filter.

16. The multiplexer according to claim 11, wherein each of the first acoustic wave resonator and the second acoustic wave resonator define and functions as a capacitor having a predetermined capacitance in a frequency band different from the resonance point and the anti-resonance point.

17. The multiplexer according to claim 11, wherein
the first ladder filter includes a plurality of the serial resonators and a plurality of the parallel resonators;
the first acoustic wave resonator is disposed in parallel to a predetermined one of the plurality of parallel resonators; and
the second acoustic wave resonator is disposed in parallel to the serial resonator that is connected to the predetermined parallel resonator via the junction point.

18. The multiplexer according to claim 11, further comprising an inductor between the parallel resonator in the connection path and the ground.

19. The multiplexer according to claim 11, wherein
each of the first and second acoustic wave resonators includes an interdigital transducer electrode; and
the interdigital transducer electrode has a multilayer structure including a close contact layer and a main electrode layer.

20. The multiplexer according to claim 19, wherein the close contact layer is made of Ti, and the main electrode layer is made of Al containing about 1% of Cu.

* * * * *